United States Patent [19]

Lesk

[11] 4,004,949

[45] Jan. 25, 1977

[54] METHOD OF MAKING SILICON SOLAR CELLS

[75] Inventor: Israel Arnold Lesk, Scottsdale, Ariz.

[73] Assignee: Motorola, Inc., Chicago, Ill.

[22] Filed: Jan. 6, 1975

[21] Appl. No.: 538,848

[52] U.S. Cl. .............................. 148/1.5; 136/89 C; 357/30

[51] Int. Cl.² ....................................... H01L 21/265

[58] Field of Search ...................... 136/89; 148/1.5; 357/30

[56] References Cited

UNITED STATES PATENTS

| 3,359,137 | 12/1967 | Kaye et al. | 136/89 |
| 3,411,952 | 11/1968 | Ross et al. | 136/89 |
| 3,418,170 | 12/1968 | Amsterdam et al. | 136/89 |
| 3,616,528 | 11/1971 | Paine | 136/89 |
| 3,914,856 | 10/1975 | Fang | 136/89 |

*Primary Examiner*—L. Dewayne Rutledge
*Assistant Examiner*—J. Davis
*Attorney, Agent, or Firm*—Lowell E. Clark

[57] ABSTRACT

Solar cells having rounded edges are provided by ion implantation of a semiconductor body having rounded edges. Individual cells can be fabricated or a continuous ribbon of semiconductor material, the ribbon having rounded edges, can be subjected to ion implantation at its surfaces and scribed to provide discrete cells.

9 Claims, 14 Drawing Figures

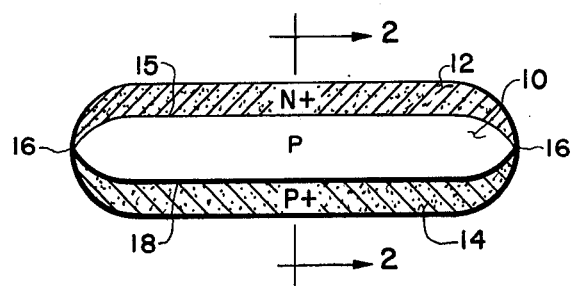
FIG. 1
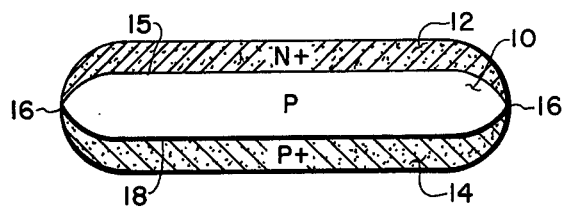
FIG. 2
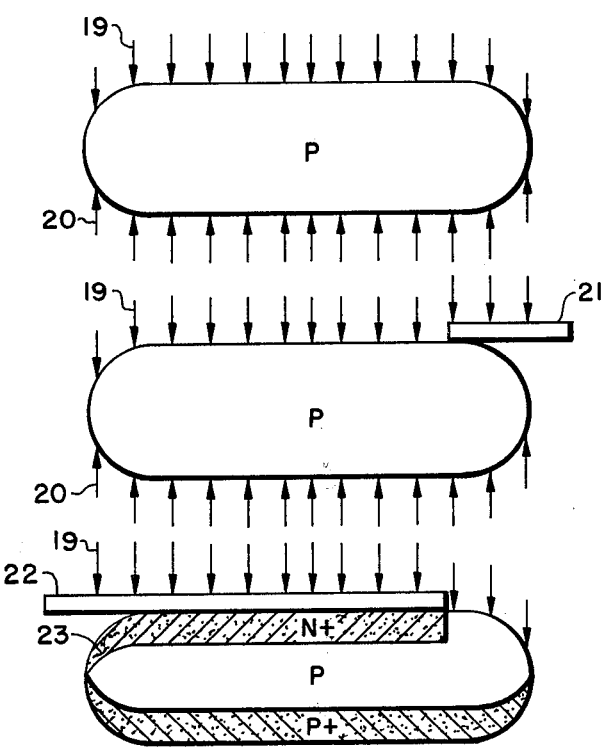
FIG. 3
FIG. 4
FIG. 5

METHOD OF MAKING SILICON SOLAR CELLS

BACKGROUND OF THE INVENTION

This invention relates to semiconductor devices, and more particularly, to solar cells for directly converting solar energy to electrical energy. In the prior art, solar cells are generally fabricated from single unitary semiconductor crystal bodies of rectangular or round shape. The current capability of the cell is proportional to its radiation collection surface, and the voltage output of a cell is determined by the semiconductor utilized, being typically about 1/2 volt for silicon. Accordingly, many solar cells are generally connected together, in series and parallel, in order to provide a panel having the desired power output.

The interconnection of these cells presents numerous manufacturing problems which prior art researchers have attempted to obviate. For example, U.S. Pat. Nos. 3,411,952 and 3,418,170 disclose wrap-around cell designs in which a P-type conductivity region is provided around the top, one edge, and part of an N-type body portion. A metal electrode is connected to the P-type region on the top, side edge and bottom and another electrode is connected to the N-type region on the bottom. Then the individual cells are soldered to conductive strips on an insulated substrate to provide the desired panel.

Others have attempted to eliminate the soldering step by providing cells having all electrical contacts on the front or light-gathering surface of the cell. This is done by providing contacts at corners of the rectangular bodies as described in U.S. Pat. Nos. 3,359,137 and 3,616,528. However, the process steps for providing these structures are costly and cumbersome since they generally require masking of the cells prior to diffusion, or etching part of a diffused layer subsequent to diffusion on one surface.

SUMMARY OF THE INVENTION

It is an object of this invention to provide solar cells having rounded edges formed without photoresist masking or etching.

A further object is the provision of such a cell which has low leakage current across the P-N junction at its edges.

Another object is the provision of a process for providing a solar cell having a junction formed therein without high temperature, photoresist, or other costly manufacturing procedures.

These and other objects and advantages will become apparent from the following description of the invention.

This invention provides a solar cell having rounded edges and comprising a semiconductor body of a first conductivity type, an upper layer of an ion implanted doped second conductivity type defining a junction therewith, and a lower layer of a doped first conductivity type defining a boundary therewith, the rounded edges defining a periphery where the junction and the boundary at least intersect. The invention also provides a process for making the aforementioned solar cell without masking or high temperature techniques. In summary this is accomplished by employing a semiconductor body having rounded edges and subjecting it to ion implantation to provide the desired structure without masking.

The invention will be better understood by reference to the following description and the accompanying drawings.

BRIEF DESCRIPTION OF THE DRAWINGS

FIG. 1 is a sectional view of a solar cell in accordance with this invention.

FIG. 2 is a sectional view taken along line 2—2 of FIG. 1.

FIG. 3 is a sectional view illustrating a step in the method of making a cell in accordance with this invention.

FIGS. 4, 2 and 5 represent a variation of the method of FIG. 3 employing an implantation barrier.

DETAILED DESCRIPTION

Figure 6:
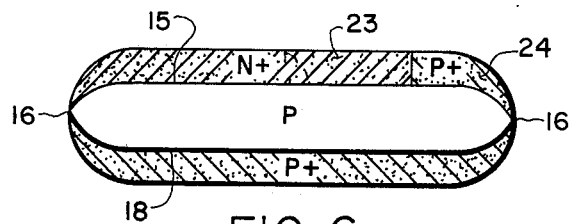
FIG. 6 is a cross-sectional view of a cell after implantation according to the method of FIGS. 4 and 5.

Referring to FIG. 1, there is shown a cross section of a solar cell having a P-type body 10, an ion implanted doped N-type upper layer 12 and an ion implanted doped P-type bottom layer 14. As is evident from the drawing, a P-N junction 15 intersects boundary 18 between the P and P+ regions around the periphery of the cell, the periphery being indicated by the numeral 16 in this cross-sectional view.

FIG. 2, which is a sectional view along lines 2—2 of FIG. 1, represents the symmetry of the cell, the same numerals being used as in FIG. 1 to depict the respective parts described above. While FIGS. 1 and 2 represent a square cell having rounded edges, other rectangular or circular cells having rounded edges are within the scope of this invention.

FIG. 3 is a sectional view illustrating ion implantation to fabricate the cell shown in FIGS. 1 and 2. Ion implantation is a process commonly utilized by the semiconductor industry to introduce specific donor and acceptor impurities into the surface region of a silicon wafer. Thus, the arrows 19 represent N-type ion implantation, while the arrows 20 represent P-type implantation. The advantage of this invention will be apparent from FIGS. 1–3. Thus, ion implantation is carried out as in FIG. 3 and results in a cell as shown in FIGS. 1 and 2 having a clearly defined P-N junction, and a boundary between the P and P+ regions. The boundary at least intersects the junction around the periphery of the cell. By the term "at least intersect" in the claims and specification herein is meant that the boundary and the P-N junction can meet or the P+ and N+ regions can overlap.

It is evident that the shape of the starting semiconductor body is a critical factor in achieving the desired symmetry. One starts with a body having rounded edges. By the term "rounded edges" in the claims and specification herein, is meant an edge that has no angles or sharp corners, but a smooth monotonic transition from one surface to the other. Such a unit can be readily provided by etching the normally square-edged wafers with a nonpreferential etch such as a mixture of hydrofluoric and nitric acids.

FIGS. 4 and 5 show a variation of the ion implantation process wherein part of the top surface is shielded by barrier 21 prior to being subjected to ion implantation. After implantation, barrier 21 is removed and doped P-type region depicted by 24 in FIG. 6 is provided by a second P-type implantation of the upper surface while utilizing a second barrier 22 covering doped N-type region 23. While separate barriers 21 and 22 are shown, the same barrier can be used provided it is of sufficient size to cover region 23 during the second implantation of the top layer. The reason for region 24 will be apparent from the discussion of FIGS. 13 and 14 hereinafter. It should be noted that the use of a mechanical barrier at this point does not present the difficulties inherent in photoresist masking if used to provide regions 23 and 24. As previously discussed, the ease with which cells having rounded edges are obtained according to this invention is an important factor in increasing the efficiency of the production of solar cells.

This invention is also applicable to silicon ribbons having rounded edges which have been grown directly by a continuous process. Typical of such ribbons are the dendrite material webbing discussed in U.S. Pat. No. 3,418,170, and ribbons grown by the edge defined film fed growth process. A discussion of the latter process is found in quarterly progress report No. 1,1 Jan–31 March 74 by D. P. Chalmers et al, 24 PNFF-RA/M-74-038. The edges of such ribbons can, if necessary, be made to have the rounded edges described above and are useful in the practice of this invention.

Figure 7:
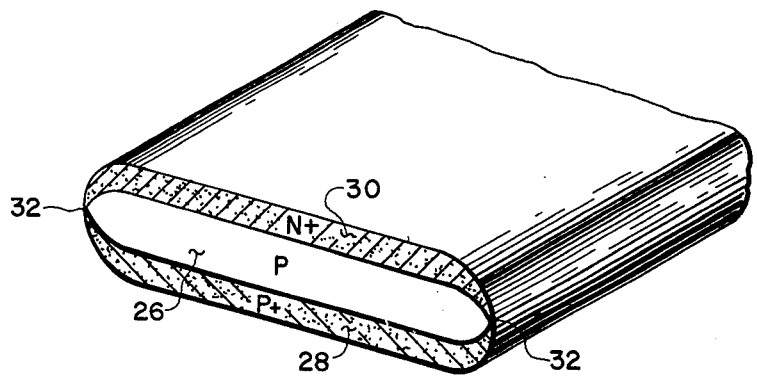
FIG. 7 is a perspective end view of part of a continuous ribbon that has been subjected to ion implantation.

FIG. 7 is a perspective end view of part of a continuous ribbon that has been implanted with ions along its length and width in accordance with the process described with reference to FIGS. 1–3. In this figure, the P-type body is represented by the numeral 26, the implanted doped P-type region by 28 and the implanted doped N-type region by 30. The periphery is represented by 32.

Figure 8:
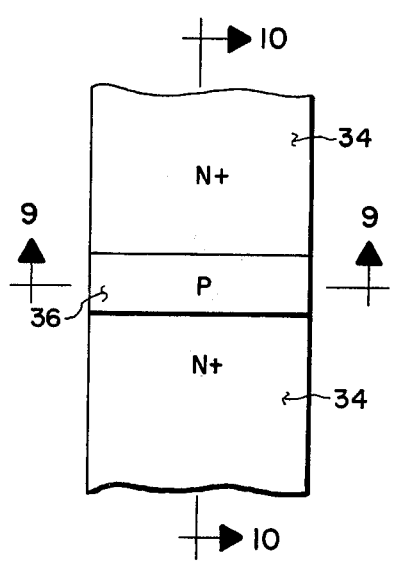
FIG. 8 is a top view of part of a continuous ribbon that utilized a strip barrier to ion implantation of the top surface.
Figure 9:
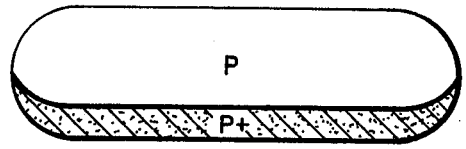
FIG. 9 is a sectional view of the ribbon of FIG. 8 taken along line 9—9 thereof.
Figure 10:
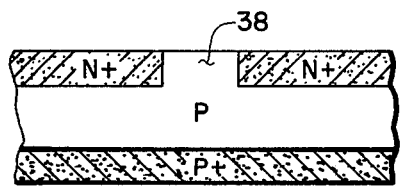
FIG. 10 is a sectional view of the ribbon of FIG. 8 taken along line 10—10 thereof.
Figure 11:
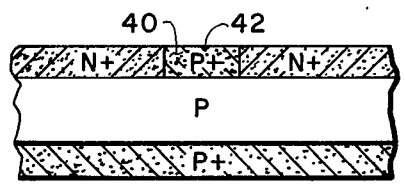
FIG. 11 is a sectional view similar to FIG. 10 after additional implantation into the top surface.

A continuous ribbon of this type can be scribed at any point along its length and the broken edges rounded by etching as described previously to provide, subsequent to ion implantation, individual units as shown in FIGS. 1 and 2. Alternately, barriers can be provided during implantation into the upper surface of a continuous ribbon in order to yield a structure such as that described in FIG. 6. This is readily achieved in a continuous ribbon process by placing a barrier over the top surface of the ribbon at intervals prior to ion implantation to provide the doped N-type region. This step will be clear from the top sectional view in FIG. 8 which represents a view after the barrier has been removed. The doped N-type region is represented by the numeral 34 wherein the P-type region which corresponds to the region underlying the barrier during implantation, is represented by 36. FIGS. 9 and 10 are cross-sectional view of the ribbon in FIG. 8 taken along lines 9—9 and 10—10 respectively. These figures indicate that there are P-type regions between the doped N-type regions on the top of the ribbon. These voids, one of which is represented by 38 in FIG. 10, may then be implanted to provide a doped P-type region 40 as shown in FIG. 11, to facilitate making ohmic contact. This is achieved by any suitable means, such as using barriers to cover the doped N-type regions and an additional ion implantation procedure. It should be noted that this second implantation of the top surface can be carried out prior to or subsequent to the implantation of the bottom surface. Then, the units are scribed at 42, for example by diamond point or laser beam. The resultant units will have rounded edges along the sides but not along the longitudinal direction of the ribbon. However, the P-N junction will be isolated from potential leakage along the scribed boundaries by P+ regions 40. Thus, the unit shown in section in FIG. 12 may be used directly.

Figure 12:
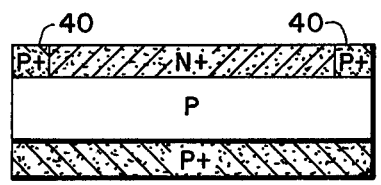
FIG. 12 is a sectional view of a cell provided by breaking the ribbon of FIG. 11 into discrete lengths.
Figure 13:
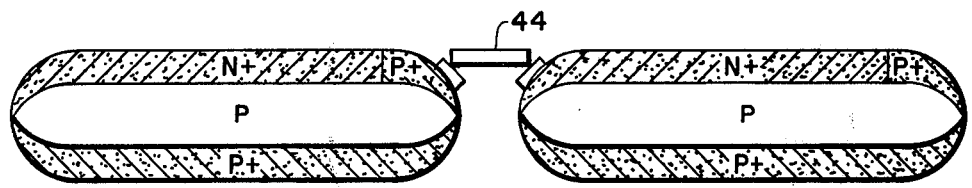
FIGS. 13 and 14 are sectional views of cells connected in series.
Figure 14:
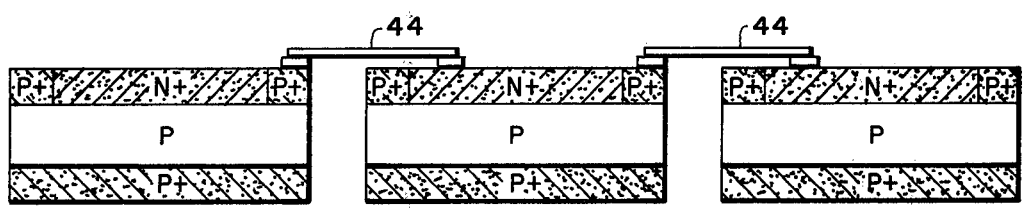

FIGS. 13 and 14 show the cells of FIGS. 6 and 12 respectively connected in series by metal strip 44. It will be evident from these figures that individual cells can be placed very close together in series and connected by simple metal strips to provide the desired solar panel.

While the drawings have been described with respect to a P-type body implanted on the top with an N-type region and on the bottom with a P-type region, the invention is not limited to such an arrangement. Thus, one may start with a body of N-type material, and provide N- and P-type regions on opposite surfaces thereof.

Although the invention has been described in connection with certain preferred embodiments, it is not intended that the invention be limited thereto. Thus, it is intended that the invention cover all alternative arrangements, equivalents, and embodiments as may be included within the scope of the following claims.

What is claimed is:

1. A method for making a silicon solar cell, which comprises:

providing a silicon substrate of a first conductivity type having first and second opposing surfaces and at least two opposing rounded edges joining said first and second surfaces, ion implanting an impurity of a second conductivity type into one of said first and second surfaces of said silicon body to form a second conductivity type region extending from said one surface into said substrate and forming a P-N junction with said substrate which terminates at at least one of said rounded edges, ion implanting an impurity of the first conductivity type into the other of said first and second surfaces to form a first conductivity type region having a greater doping level than said substrate extending from said other surface into said substrate and forming a boundary with said substrate extending into said substrate a sufficient extent to terminate against said at least one of said rounded edges and contact said P-N junction, and forming electrical contacts to said first and second conductivity type regions.

2. The method of claim 1 in which all edges of the semiconductor substrate are rounded.

3. The method of claim 1 in which said first conductivity type is P and said second conductivity type is N.

4. The method of claim 1 additionally comprising:

providing a barrier to ion implantation over a portion of said one of said surfaces lying at least in part along the other of said rounded edges during said step of implanting with said second conductivity type impurity, providing a barrier to ion implantation on said one of said surfaces over said second conductivity type region, and ion implanting an impurity of said first conductivity type into said portion of said one of said surfaces to form an additional first conductivity type region having a greater doping level than said substrate extending from said portion of said one of said surfaces into said substrate a sufficient extent to terminate against said other of said rounded edges and contact said first conductivity type region formed into said other of said surfaces at said other of said rounded edges.

5. The method of claim 4 in which said first conductivity type is P and said second conductivity type is N.

6. A method for making silicon solar cells, which comprises:

providing a continuous ribbon silicon substrate of a first conductivity type having first and second opposing surfaces and two opposing rounded edges joining said first and second surfaces, ion implanting an impurity of the first conductivity type into one of said first and second surfaces to form a first conductivity type region having a greater doping level than said substrate and terminating against said two opposing edges, providing first ion implantation barriers at intervals along said substrate and extending across said substrate on the other of said first and second surfaces between said rounded edges, ion implanting an impurity of a second conductivity type into said other surface to form second conductivity type regions extending from said other surface into said substrate and forming a P-N junction thereat sufficiently deep to terminate against said two opposing edges and make contact with said first conductivity type region at said two opposing edges, removing said first ion implantation barriers and providing second ion implantation barriers over said second conductivity type regions on said other surface, ion implanting a first conductivity type impurity into the portions of said other surface previously covered by said first ion implantation barriers to form additional regions of said first conductivity type having a doping level higher than said substrate between said second conductivity type regions, extending between said opposing rounded edges and being sufficiently deep to contact said first conductivity type region at said edges, scribing said substrate within said additional regions between said opposing rounded edges to provide a plurality of separate solar cell substrates, and making electrical contact to said ion implanted regions in each of said substrates.

7. The method of claim 6 in which said first conductivity type is P and said second conductivity type is N.

8. A method for making silicon solar cells, which comprises:

providing a continuous ribbon silicon substrate of a first conductivity type having first and second opposing surfaces and two opposed rounded edges joining said first and second surfaces, scribing said substrate between said opposing rounded edges at intervals to provide a plurality of separate solar cell substrates having scribed edges, treating said scribed edges to provide rounded edges around the entire periphery of each separate solar cell substrate, ion implanting an impurity of a second conductivity type into one of said first and second surfaces of said solar cell substrates to form a second conductivity type region in said solar cell substrates extending from said one surface into said substrates and forming a P-N junction with said substrate which terminates at said rounded edges, ion implanting an impurity of the first conductivity type into the other of said first and second surfaces of said solar cell substrates to form a first conductivity type region in each solar cell substrate having a greater doping level than said solar cell substrates extending from said other surface of said solar cell substrates into said solar cell substrates and forming boundaries therewith extending into said solar cell substrates a sufficient extent to terminate against said rounded edges of said solar cell substrates and contact said P-N junction in said solar cell substrates, and forming electrical contacts to said first and second conductivity type regions in said solar cell substrates.

9. The method of claim 8 in which said first conductivity type is P and said second conductivity type is N.

* * * * *